United States Patent [19]

Wolf et al.

[11] Patent Number: 5,300,140

[45] Date of Patent: Apr. 5, 1994

[54] HYDROPRIMER FOR METALLISING SUBSTRATE SURFACES

[75] Inventors: Gerhard-Dieter Wolf, Dormagen; Ulrich von Gizycki; Wolfgang Cohnen, both of Leverkusen; Günther Reichert, Cologne; Gert Jabs, Odenthal, all of Fed. Rep. of Germany

[73] Assignee: Bayer Aktiengesellschaft, Leverkusen, Fed. Rep. of Germany

[21] Appl. No.: 842,715

[22] Filed: Feb. 27, 1992

[30] Foreign Application Priority Data

Mar. 9, 1991 [DE] Fed. Rep. of Germany ....... 4107644

[51] Int. Cl.$^5$ ............................................. C23C 18/28
[52] U.S. Cl. ................................. 106/1.11; 427/443.1; 106/1.26; 106/1.28
[58] Field of Search ............................. 106/1.11–1.29; 427/443.1

[56] References Cited

U.S. PATENT DOCUMENTS 3,900,320  8/1975  Rolker et al. ........................ 430/324
3,930,109 12/1975  Brandt et al. ........................ 428/422

Primary Examiner—Helene Klemanski
Assistant Examiner—Margaret Einsmann
Attorney, Agent, or Firm—Sprung Horn Kramer & Woods

[57] ABSTRACT

Formulations which contain a water-dispersible polymer, a metallization catalyst, if appropriate fillers, if appropriate other constituents and water are outstandingly suitable for the pretreatment of various substrate surfaces for the purpose of subsequent metallization in a currentless metallization bath.

14 Claims, No Drawings

HYDROPRIMER FOR METALLISING SUBSTRATE SURFACES

BACKGROUND OF THE INVENTION

1. FIELD OF THE INVENTION

The invention relates to formulations based on aqueous dispersions, which, in addition to water, essentially contain water-dispersible polyurethanes, metallisation activators and preferably also fillers.

These formulations are used for the pretreatment of various substrate surfaces, for example surfaces of plastics, for the purpose of subsequent metallisation in currentless metallisation baths.

Components of plastic which have been activated using these formulations are preferably employed for shielding from electromagnetic waves after metallisation has been carried out.

2. Description of the Related Art

It is known that polymeric materials must be pretreated before chemical and subsequent electroplating metallisation in order to achieve adequate adhesion of the metallic layer to the surface of the material. The pretreatment is mainly carried out by etching the polymer surface with chromic/sulfuric acids, which pollute the environment. However, the use of chromic/sulfuric acid, $SO_3$ vapour or other oxidising agents is accompanied by a deterioration in the physical properties, such as the impact strength and the electrical surface resistance of the polymeric material. Traces of 6-valent chromium, which can rapidly lead to poisoning of the metal baths, moreover often cause trouble.

The known processes for the currentless metallisation of materials furthermore comprise several process stages and have the disadvantage that they cannot be used directly on all polymers. Chemical swelling or physical roughening must often additionally be carried out.

It has therefore already been proposed to activate the polymer surfaces very gently using organometallic catalysts (DE-A 3,560,257 and EP-A 81,129). Nevertheless, this progressive method is also not universally applicable. The use of solvents moreover often leads to stress corrosion cracking being caused in the injection moulded parts of the polymer which are under tensile or compressive stress.

Other processes, such as are described in U.S. Pat. Nos. 3,560,257 and 4,017,265 as well as DE-A 3,627,256, have the disadvantage that they require larger amounts of expensive noble metal activators.

Specific adhesion-promoting plastics coatings are furthermore known from DE-A 3,814,506. However, these must be activated in activation baths before their metallisation, which may lead to geometry-related foreign deposition in cases of partial metallisation.

SUMMARY OF THE INVENTION

The object of the present invention was therefore the development of both an economical and a universally applicable process for the chemical metallisation of material surfaces based on glasses, metals and in particular plastics, with which firmly adhering metal coatings which are deposited by a wet-chemical route can be applied to the substrates without prior etching with oxidising agents but with which the disadvantages caused by the solvents should be avoided.

The object is achieved by coating substrate surfaces with a specific hydroprimer which essentially consists of an aqueous dispersion of a polymeric organic film-forming or matrix-forming agent and of metallisation activators and if appropriate fillers. After drying, the substrate surfaces coated with this hydroprimer can be provided with firmly adhering metal coatings in chemical metallisation baths. The term hydroprimer refers both to unfilled aqueous polymer dispersions and to those filled with fillers.

The hydroprimer according to the invention essentially consists of a) a water-dispersible polymer, preferably a polyurethane, in amounts of 5–60% by weight, preferably 15–45% by weight, b) a metallisation catalyst, called an activator below, in amounts of 0.02–3.5% by weight, preferably 0.05–0.5% by weight, c) if appropriate fillers, in amounts of 0–70% by weight, preferably 5–35% by weight, d) if appropriate other constituents in amounts of 0–15% by weight, preferably 0–2% by weight, and e) water in amounts of 20–88% by weight, preferably 25–50% by weight, in each case based on the total amount of the hydroprimer.

DETAILED DESCRIPTION OF THE INVENTION

The hydroprimer according to the invention has the great advantage that it contains substantially no organic solvents and is thus environment-friendly. Another advantage of this hydroprimer is that the composition described for this hydroprimer does not tend to produce spray mists during spraying.

After the hydroprimer has been sprayed onto the substrate surfaces and dried, the substrates can be provided with various firmly adhering metal coatings in chemical metallisation baths.

All dispersible polymers, for example polyacrylates, polybutadienes, polyesters and melamine resins, can in principle be employed in the hydroprimers according to the invention. Polyurethanes or polyurethane-ureas such as are described, for example, in Angewandte Chemie 82 (1970), pages 53–63, and DE-A 2,314,512 or 2,314,513, are preferably used. Particularly preferred dispersible polyurethanes correspond to the description in DE-A 2,651,506. These preferred dispersible polyurethanes essentially have a linear molecular structure and are characterised by a) terminal polyalkylene oxide-polyether chains having a content of ethylene oxide units of 0.5–10% by weight, based on the total polyurethane, and b) a content of $=N^{\oplus}=$, $—S^{\oplus}—$, $13 \text{ COO}^{\ominus}$ or $—SO_3^{\ominus}$ groups of 0.1–15 milliequivalents per 100 g.

The composition of such preferred dispersible polyurethanes and their preparation are described in detail in DE-A 2,651,506. These dispersible polyurethanes are preferentially used because they have an improved heat stability and moreover allow the activators required for the metallisation to be admixed in low concentrations. The dispersible polymers are employed in amounts of between 5 and 60% by weight, preferably 15–45% by weight.

Possible activators in the hydroprimers according to the invention are organometallic compounds of the first and eighth sub-groups of the periodic system (in particular of Pd, Pt, Au or Ag), such as are described, for example, in EP-A 34,485, 81,438 or 131,198. The organometallic complex compounds of palladium with olefins (dienes), with α-unsaturated carbonyl compounds, with crown ethers, with nitriles and with diketones, such as pentanedione, deserve particular mention.

Ionic metals in the form of salts, such as halides, acetates, nitrates, carbonates, sulphates, sulphides and hydroxides, are likewise possible. Here also, the salts of Pd, Pt, Au and Ag are preferred. Examples are PdS, $Na_2PdCl_4$, $Na_2PdCN_4$, $H_2PtCl_6$, $AgNO_3$, $AG_2SO_4$ and $Ag_2S$.

If coagulation already takes place during addition of the activators to the aqueous dispersion, either the concentration of the activator should be reduced or another salt or another complex should be employed as the activator.

Particularly good results are achieved with those compounds in which the noble metal salt is bonded very strongly as a complex, for example bis-acetonitrile-palladium dichloride, if it is additionally also complexed with aminopyridine, or the silver diammine complex $[Ag(NH_3)_2]^\oplus$ or those noble metal salts which are relatively sparingly soluble in cold water, for example $Ag_2SO_4$, $AgNO_2$, Ag acetate and $AgMnO_4$.

Zero-valent complex compounds, such as palladium(0) tetrakis-(triphenylphosphine) are furthermore possible.

Pd black, Pd-on-charcoal, Pd-on-aluminum oxide, Pd-on-barium sulphate and Pd-on-A charcoal may be referred to as colloidal noble metal systems which can also be used as activators.

Provided that such compounds are compatible with the selected aqueous dispersions into which they are to be incorporated, mixtures of such compounds can also be employed.

The amount of noble metal can be varied widely in the range from 0.02-3.5% by weight, based on the hydroprimer mass. The preferred amount of noble metal is 0.025-1.5% by weight, especially preferably 0.05-0.5% by weight.

Possible fillers are auxiliaries known from printing and coating technology, such as pigments, disperse silicic acid, carbon blacks or other carbon powders, silicates, rheological additives and clay minerals. Reference can thus be made in particular to the oxides of the elements Mn, Ti, Mg, Al, Bi, Cu, Ni, Sn, Zn and Si. Silicates, bentonites, talc and chalk are also preferably employed. Titanium oxide and talc are particularly preferably employed in the context of the present invention.

The amount of filler can be varied widely in the range from 0.5-70, but preferably 5-35% by weight, based on the mass of the hydroprimer. In specific embodiments, it can also be completely absent.

In addition to the dispersible polymers, activators and fillers, if appropriate other constituents, such as surfactants, flow agents, foam suppressants and dyestuffs, can also be admixed in low concentrations of up to 15% by weight, preferably up to 2% by weight. The addition of a very small amount of a solvent may also have an advantageous effect, for example the addition of 1-9% by volume of N-methylpyrrolidone.

The formulations according to the invention are in general prepared by mixing the constituents. Incorporation of the formulation components can of course also be carried out in separate steps. Auxiliary units, such as ball or bead mills, a Skandex or a Red Devil, can be employed to achieve a particularly homogeneous distribution.

The hydroprimer can be applied to the surfaces of the plastic by the customary methods, such as printing, stamping, dipping, brushing, knife-coating, painting on and rolling on and spraying. Surfaces can preferably be activated, for the purpose of a firmly adhering chemical metallisation, by spraying the primers according to the invention by means of processes known from the paint industry.

The coating thickness of the hydroprimer applied can be varied in the range from 5-200 μm, but preferably in the range from 10-50 μm.

In this connection, it should be expressly mentioned that a swelling or initial etching pretreatment of the plastic is not necessary because of the use of the hydroprimers according to the invention. No occurrence of stress cracking is therefore possible.

Suitable substrates for the process according to the invention are workpieces based on inorganic glasses, metals and in particular plastics. Plastics such as are employed in the electrical, electronics and domestic sector are particularly preferred. Reference may be made in this connection to ABS, polycarbonate and mixtures thereof and also to their grades having a flameproof finish, such as, for example, Bayblend ® FRZ90, 1441, 1439 and 1448. Other examples of plastics are: polyamides, polyester grades, for example including polybutylene terephthalate, PVC, polyethylene and polypropylene, polyphenylene sulphide, polyphenylene oxide and polyurethanes.

After the application of the formulations according to the invention to the surface of the substrates, the water is removed by drying. This is carried out at substrate-specific temperatures, for example between room temperature and 200° C., under normal pressure or in vacuo. The drying time can be varied here.

If appropriate, the surfaces thus treated must then be sensitised by reduction. The reducing agents customary in electroplating, such as hydrazine hydrate, formaldehyde, hypophosphite and boranes, for example dimethylaminoborane, can preferably be used for this. Other reducing agents are of course also possible. The reduction is preferably carried out in aqueous solution. However, other solvents, such as alcohols, ethers and hydrocarbons, can also be employed. Suspensions or slurries of the reducing agents can of course also be used.

The surfaces thus activated can be employed directly for currentless metallisation. However, it may also be necessary to clean the surface by rinsing off residues of reducing agent.

A preferred embodiment of the process according to the invention comprises carrying out the reduction in the metallisation bath directly with the reducing agent of the currentless metallisation. This embodiment represents a simplification of the metallisation process. This simplified embodiment of the process consists only of 3 working operations: application, in particular spraying on, of the hydroprimer, drying and dipping of the surfaces thus activated into the metallisation bath. This embodiment is especially suitable for nickel baths containing aminoborane or copper baths containing formalin.

Possible metallisation baths which can be employed in the process according to the invention are preferably those from which nickel, cobalt, copper, gold or silver and mixtures with one another or with iron can be deposited. Such metallisation baths are known in the art of currentless metallisation.

The process according to the invention has the advantage that it can also be carried out without the substrate surface being given a prior oxidative etching and/or swelling or treatment with solvents having polymer chains. The firmly adhering metal deposit is achieved with the aid of the hydroprimer coating applied which is capable of metallisation.

The process moreover has the advantage that it can be carried out without any organic solvent or with only small amounts of an organic solvent, which means it qualifies as being particularly environment-friendly.

The new process thus allows an inexpensive deposition of metals both over the entire area and over part areas of material surfaces which is gentle on the material and particularly environment-friendly.

Materials metallised by the new process are distinguished by their outstanding shielding from electromagnetic waves. The materials thus finished are used in the electrical, car, electronics and domestic sector.

The good mechanical properties of the polymeric base material in respect of impact strength, notched impact strength, flexural strength and edge elongation are not adversely influenced by the coating or metallisation operation.

EXAMPLES

EXAMPLE 1

A 100×200 mm test sheet of a blend consisting of 60% of a polyester of 4,4'-dihydroxydiphenyl-2,2-propane and carbonic acid and 40% of acrylonitrile-butadiene-styrene copolymer having a Vicat temperature of about 90° C. was provided with a hydroprimer layer on one side by spraying and dried at 65° C. in the course of 45 minutes. The dry layer thickness was about 40 μm. The hydroprimer consisted of
624 parts by weight of a 40% strength aqueous dispersion of a polyurethane consisting of linear, slightly branched aliphatic chains which contain incorporated —COO⁻ or —SO₃⁻ groups, according to DE-A 2,651,506, having a particle size of 50 to 450 nm
100 parts by weight of TiO₂
200 parts by weight of talc and
76 parts by weight of an aqueous solution which contained 3.5 parts by weight (based on the total weight of the hydroprimer of 1000 parts by weight) of the silver diammine complex [Ag(NH₃)₂]⁺.

The test sheet was treated for 10 minutes at 30° C. in a reduction bath consisting of 10 g of dimethylaminoborane and 1.0 g of NaOH in 1 liter of water, subsequently coppered at room temperature in a commercially available chemical coppering bath in the course of 30 minutes, washed with distilled water and then dried at 65° C. for 30 minutes.

A sheet metallised on one side and having a copper layer 1.9 μm thick was obtained. This sheet provided exceptionally good screening from electromagnetic waves. 35 dB were measured in the near field at 27 MHz.

The metal deposit adhered so firmly to the surface of the plastic that both the adhesive-tape test according to DIN 53 151 and an alternating temperature test with temperature alternations between −40° and +70° C. were passed with very good results.

The metal deposit furthermore had a peel strength according to DIN 53 494 of 25N/25 mm.

If instead of the test sheet of the blend described above a sheet of equal size of polyamide or of a polyurethane was employed, outstanding results were likewise obtained.

EXAMPLE 2

A 100×200 mm ABS sheet was coated on one side with a hydroprimer consisting of
652 parts by weight of a 40% strength aqueous dispersion of a polyurethane consisting of linear, slightly branched aliphatic chains which contain incorporated COO⁻ or —SO₃⁻ groups, according to DE-A 2,651,506, having a particle size of 50 to 450 nm
115 parts by weight of TiO₂
230 parts by weight of talc and
3 parts by weight of Ag₂SO₄
in a layer about 15 μm thick by means of a spray robot, subsequently sensitised and coppered in accordance with Example 1 and heat-treated at 70° C. for 20 minutes. A sheet of plastic which provided good shielding from electromagnetic waves and had good adhesion of the metal was obtained. The adhesion of the metal deposit, in accordance with DIN 53 494, was 20 N/25 mm.

EXAMPLE 3

A 100×200 mm test sheet consisting of about 70% of a polyester of 4,4'-dihydroxydiphenyl-2,2-propane and carbonic acid was provided with a hydroprimer layer and then with a metal deposit in accordance with Example 1. A sheet which provided good shielding from electromagnetic waves and had good adhesion of the metal was obtained.

The metal deposit had a peel strength according to DIN 53 494 of 20 N/25 mm. The alternating temperature test described in Example 1 was also passed with good results.

EXAMPLE 4

A 100×200 mm polyphenylene oxide/polystyrene sheet was provided on one side with a hydroprimer consisting of
920 parts by weight of a 40% strength aqueous dispersion of a polyurethane consisting of linear, slightly branched aliphatic chains which contain incorporated —COO⁻ or —SO₃⁻ groups, according to DE-A 2,651,506, having a particle size of 50 to 450 mm and
80 parts by weight of an aqueous solution which contained 5 parts by weight (based on the total amount of the hydroprimer of 1000 parts by weight) of bisacetonitrile-palladium dichloride complex, which was additionally complexed with 2-aminopyridine, and was dried at 60° C. in the course of 45 minutes.

The sheet containing the hydroprimer was coated with a Cu deposit 2.6 μm thick in a chemical coppering bath in the course of 40 minutes.

A sheet of plastic which was metallised on one side and had good adhesion of the metal was obtained. The adhesive strength in accordance with DIN 53 494 was 12 N/25 mm.

This plate provided exceptionally good screening from electromagnetic waves.

What is claimed is:

1. A hydroprimer for the deposition of firmly adhering metal coatings onto substrate surfaces by application of a thin layer of the hydroprimer to the substrate surface, if appropriate sensitisation and subsequent currentless wet-chemical metallisation, wherein the hydroprimer contains, as the essential constituents,
- a) a water-dispersible polymer selected from the group consisting of water-dispersible polyacrylates, polybutadienes, polyesters, melamine resins, polyurethanes, and polyurethane-ureas,
- b) as metallisation catalyst an ionic noble metal, a colloidal noble metal or both or a covalent or complex compound of a noble metal with organic ligands,
- c) a filler selected from the group consisting of organic and inorganic fillers, in an amount of 5 to 35% by weight, and
- d) water.

2. The hydroprimer of claim 1, which contains, as the essential constituents,
- a) said water-dispersible polymer in amounts of 5–60% by weight,
- b) a metallisation catalyst of noble metal compounds in amounts of 0.02–3.5% by weight, and
- c) said water in amounts of 20–88% by weight, in each case based on the total amount of the hydroprimer.

3. The hydroprimer of claim 2, wherein the water-dispersable polymer is a polyurethane.

4. The hydroprimer of claim 2, which contains the water-dispersable polymer in amounts of 15–45% by weight.

5. The hydroprimer of claim 2, which contains the metallisation catalyst in amounts of 0.05–0.5% by weight.

6. The hydroprimer of claim 2, which contains water in amounts of 25–50% by weight.

7. The hydroprimer of claim 3, wherein the water-dispersible polymer consists of a polyurethane having a predominantly linear molecular structure and
- a) terminal polyalkylene oxide-polyether chains having a content of ethylene oxide units of 0.5–10% by weight, based on the total polyurethane, and
- b) a content of $=N^{\oplus}=$, $-S^{\oplus}-$, $-COO^{\oplus}$ or $-SO_3^{\oplus}$ groups of 0.1–15 milliequivalents.

8. The hydroprimer of claim 1, which contains, as the constituent b), complex compounds or inorganic salts of the elements Au, Ag, Pt, Pd or Ru.

9. The hydroprimer of claim 8, which contains the constituent b) in amounts of 0.05–0.5% by weight.

10. The hydroprimer of claim 8, which contains bis-acetonitrile-palladium dichloride, which is additionally complexed with 2-aminopyridine, as the constituent b).

11. The hydroprimer of claim 8, which contains the silver diamine complex $[Ag(NH_3)_2]^{\oplus}$ as the constituent b).

12. The hydroprimer of claim 8, which contains the silver salts $Ag_2SO_4$, $AgNO_2$, Ag acetate and $AgMnO_4$ which are relatively sparingly soluble in cold water as the constituent b).

13. The hydroprimer of claim 1, which contains one or more fillers selected from the group consisting of silicates, bentonites, talc, chalk, and the oxides of each of the individual elements Mn, Ti, Mg, Al, Bi, Cu, Ni, Sn, Zn and Si, in an amount of 5–35% by weight, based on the mass of the hydroprimer.

14. The hydroprimer of claim 13, which contains one or more fillers selected from the group consisting of titanium dioxide and talc.

* * * * *